(12) United States Patent
Swatsky et al.

(10) Patent No.: US 7,796,057 B2
(45) Date of Patent: Sep. 14, 2010

(54) METHOD OF CONFIGURING A KEYPAD OF A LOAD CONTROL SYSTEM

(75) Inventors: Matthew Joseph Swatsky, Macungie, PA (US); Galen Edgar Knode, Macungie, PA (US)

(73) Assignee: Lutron Electronics Co., Inc., Coopersburg, PA (US)

( * ) Notice: Subject to any disclaimer, the term of this patent is extended or adjusted under 35 U.S.C. 154(b) by 901 days.

(21) Appl. No.: 11/636,095

(22) Filed: Dec. 8, 2006

(65) Prior Publication Data

US 2008/0136680 A1 Jun. 12, 2008

(51) Int. Cl.
*H03M 11/00* (2006.01)

(52) U.S. Cl. .............................. 341/23; 341/20; 341/22; 345/168; 200/5 A; 200/310; 200/314; 160/331

(58) Field of Classification Search .................. 341/20, 341/22, 26; 345/168; 200/5 A, 310, 314; 160/331
See application file for complete search history.

(56) References Cited

U.S. PATENT DOCUMENTS

| | | | |
|---|---|---|---|
| 5,191,265 A | 3/1993 | D'Aleo et al. | |
| 5,463,286 A | 10/1995 | D'Aleo et al. | |
| 5,530,322 A | 6/1996 | Ference et al. | |
| 5,865,546 A * | 2/1999 | Ganthier et al. | 400/489 |
| 6,104,604 A * | 8/2000 | Anderson et al. | 361/679.55 |
| 6,317,061 B1 * | 11/2001 | Batra et al. | 341/22 |
| 6,380,696 B1 | 4/2002 | Sembhi et al. | |
| 6,545,434 B2 | 4/2003 | Sembhi et al. | |
| 6,803,728 B2 | 10/2004 | Balasubramaniam et al. | |
| 6,876,312 B2 * | 4/2005 | Yu | 341/20 |
| 6,983,783 B2 | 1/2006 | Carmen, Jr. et al. | |
| 7,038,598 B2 * | 5/2006 | Uke | 341/20 |
| 7,190,125 B2 | 3/2007 | McDonough et al. | |
| 7,310,054 B2 * | 12/2007 | Wu | 341/26 |
| 7,361,853 B2 | 4/2008 | Clegg et al. | |
| 7,414,210 B2 | 8/2008 | Clegg et al. | |
| 7,432,460 B2 | 10/2008 | Clegg et al. | |
| 7,432,463 B2 | 10/2008 | Clegg et al. | |

(Continued)

OTHER PUBLICATIONS

European Patent Office, International Search Report and Written Opinion for International Patent Application No. PCT/US2007/085786, May 8, 2008, 11 pages.

(Continued)

*Primary Examiner*—Albert K Wong
(74) *Attorney, Agent, or Firm*—Mark E. Rose; Philip N. Smith

(57) ABSTRACT

A load control system is operable to control the amount of power delivered to a plurality of electrical loads from an AC power source. The load control system includes a plurality of keypads, which each may include a different button assembly having a different button configuration. Each keypad is operable to determine the button configuration of the button assembly installed on the keypad in response to simultaneous actuations of the top button and the bottom button of the button assembly for a predetermined amount of time. Each keypad is further operable to store in a memory of the keypad data representing the button configuration. Therefore, after the keypad is installed in the field and the button assembly is replaced, the keypad can be easily configured to operate with the new button assembly.

14 Claims, 10 Drawing Sheets

U.S. PATENT DOCUMENTS

| | | | |
|---|---|---|---|
| 2002/0054024 A1* | 5/2002 | Andres et al. | 345/168 |
| 2003/0015302 A1 | 1/2003 | Pessina et al. | |
| 2005/0102040 A1 | 5/2005 | Kruse et al. | |
| 2005/0137720 A1 | 6/2005 | Spira et al. | |
| 2007/0045392 A1* | 3/2007 | Youens et al. | 235/145 R |
| 2008/0136683 A1 | 6/2008 | Swatsky et al. | |

OTHER PUBLICATIONS

Lutron Electronics Co., Inc., Radio RA Wireless Central Lighting Control Setup Guide, Dec. 2000, 52 pages.

Lutron Electronics Co., Inc., seeTouch Window Treatment Wallstations Installation Instructions, Jun. 2002, 8 pages.

Lutron Electronics Co., Inc., seeTouch GRAFIK Systems Sivoia Controller Installation Instructions, Oct. 2002, 10 pages.

Lutron Electronics Co., Inc., Application Note #7: Sivoia QED Multigroup Keypads, Apr. 2005, 2 pages.

* cited by examiner

METHOD OF CONFIGURING A KEYPAD OF A LOAD CONTROL SYSTEM

BACKGROUND OF THE INVENTION

1. Field of the Invention

The present invention relates to a keypad of a load control system for controlling the amount of power delivered to a plurality of electrical loads from an AC power source, and more particularly, to a method of easily configuring a keypad of a load control system with a new button configuration.

2. Description of the Related Art

Typical load control systems are operable to control the amount of power delivered to an electrical load, such as a lighting load or a motor load, from an alternating-current (AC) power source. A load control system generally comprises a plurality of control devices coupled to a communication link to allow for communication between the control devices. The load control system includes load control devices operable to control the amount of power delivered to the loads in response to digital messages received via the communication link or from local inputs, such as user actuations of a button. Further, the load control system often includes one or more keypads, which transmit commands across the communication link to control the loads coupled to the load control devices. An example of a lighting control system is described in greater detail in commonly-assigned U.S. Pat. No. 6,803,728, issued Oct. 12, 2004, entitled SYSTEM FOR CONTROL OF DEVICES, the entire disclosure of which is hereby incorporated by reference.

FIG. 1 is a simplified block diagram of a prior art lighting control system 10. The lighting control system 10 comprises a multi-zone lighting control unit 12 coupled between an AC power source 14 and a plurality of lighting loads 16 to individually control the amount of power delivered to, and thus the intensity of, each of the lighting loads. The multi-zone lighting control unit 12 may comprise, for example, a GRAFIK Eye® Control Unit, which is manufactured by the assignee of the present invention. The lighting control unit 12 is coupled to a communication link 18, which enables the lighting control unit to communicate with a plurality of keypads, e.g., a two-button (2B) keypad 20 and a four-scene (4S) keypad 30. The communication link 18 may be implemented as, for example, a four-wire RS-485 communication link. Each of the keypads 20, 30 is configured with a unique identifier, i.e., a unique address. Accordingly, the lighting control unit 12 is operable to transmit digital messages to the keypads using the unique addresses of the keypads. The lighting control system 10 may also comprise additional keypads, which may each have a different number of buttons at different locations on the respective front surfaces of the keypads.

FIGS. 2A and 2B are front views of the 2B keypad 20 and the 4S keypad 30. The 2B keypad 20 includes a faceplate 22 and two buttons 24A, 24B. Two visual indicators 26A, 26B, e.g., light-emitting diodes (LEDs), are located adjacent to the two buttons 24A, 24B, respectively, and provide feedback of the status of the lighting loads 16. The 2B keypad 20 may be configured with different button functionalities. For example, the buttons 24A, 24B may be configured such that an actuation of the first button 24A selects a first lighting preset (or "scene") of the lighting control unit 12, while an actuation of the second button 24B selects a second lighting preset. Accordingly, the visual indicators 26A, 26B illuminate to indicate if the first lighting preset or the second lighting preset is selected. Alternatively, the 2B keypad 20 may be configured such that actuations of the first and second buttons 24A, 24B raise and lower the intensities of the lighting loads 16, start and stop a sequence of the lighting control unit 12, or select third and fourth lighting presets. The buttons 24A, 24B may be engraved with icons or text that are descriptive of the functions that are performed by actuations of the buttons.

Referring to FIG. 2B, the 4S keypad 30 includes a faceplate 32, four scene-selection buttons 34A, 34B, 34C, 34D, an off button 38, a raise button 39A, and a lower button 39B. Actuations of the first, second, third, and fourth buttons 34A, 34B, 34C, 34D select first, second, third, and fourth lighting presets, respectively. The 4S keypad 30 includes four visual indicators 36A, 36B, 36C, 36D, which are located next to the four buttons 34A, 34B, 34C, 34D, respectively, and illuminate to indicate whether the first, second, third, or fourth lighting preset is selected. An actuation of the off button 38 causes the lighting control unit 12 to select an off scene, i.e., one in which all of the lighting loads 16 are turned off. Actuations of the raise button 39A and the lower button 39B cause the lighting control unit 12 to respectively raise and lower the intensities of the lighting loads 16. The 4S keypad 30 may be alternatively configured such that, for example, the buttons 34A, 34B, 34C, 34D select fifth, sixth, seventh, and eighth lighting presets.

In order for the lighting control unit 12 to be responsive to the 2B keypad 20 or the 4S keypad 30, each keypad must be associated with the lighting control unit. FIG. 3 is a flowchart of a prior art association procedure 80 for associating a keypad with the lighting control unit 12. First, a user simultaneously presses and holds the top and bottom buttons on one of the keypads for three (3) seconds to enter a programming mode at step 82. For example, the user can simultaneously press and hold the first button 24A and the second button 24B on the 2B keypad 20, or the first button 34A and the off button 38 on the 4S keypad 30. Accordingly, the keypad enters the programming mode and cycles the visual indicators, i.e., individually illuminates each of the visual indicators in sequence, at step 84. At step 86, the user presses the top scene button 12A on the lighting control unit to associate the lighting control unit 12 with the keypad. At step 88, the lighting control unit 12 stores the address of the keypad in memory, so that the lighting control unit 12 is now responsive to actuations of the buttons of the keypad. At step 90, the lighting control unit 12 flashes the column of visual indicators 12B in unison to indicate that the association has been made. Finally, the user simultaneously presses and holds the top and bottom buttons on the keypad for three (3) seconds at step 92, and the keypad exits the programming mode at step 94.

FIG. 4A is an exploded perspective view of the 4S keypad 30, and FIG. 4B is a front view of a base unit 40 of the 4S keypad. While the exploded view of FIG. 4A shows the 4S keypad 30, the 2B keypad 20 has a similar assembly. The base unit 40 houses the electrical circuitry of the 4S keypad 30, which is preferably mounted on a printed circuit board (not shown). A button assembly 42 includes the buttons 34A-39B and snaps to the base unit 40, such that the buttons are operable to actuate tactile switches 44A-44I mounted on the printed circuit board inside the base unit. The base unit 40 provides seven vertically arranged tactile switches 44A-44G, such that the button assembly 42 can include up to seven vertically arranged scene-selection buttons. Alternatively, the lower most of the seven scene-selection buttons can be replaced with the raise and lower buttons 39A, 39B, which actuate the tactile switches 44H, 44I. Accordingly, a plurality of different combinations, i.e., different button configurations, may be provided on the button assembly 42.

Preferably, a plurality of backlights, e.g., LEDs (not shown), are mounted on the printed circuit board immediately behind the buttons. The backlights illuminate the buttons, such that text or icons that may be engraved on the buttons can be easily read in a dark room. The base unit 40 illuminates only the buttons that are provided on the button assembly 42, i.e., per the present button configuration of the keypad. The base unit 40 does not illuminate the backlight behind the bottom button when the raise and lower buttons 39A, 39B are provided on the button assembly 42.

A faceplate adapter 46 attaches to the base unit 40 via two screws 48. The faceplate 32 snaps to the faceplate adapter 46, such that the buttons extend through openings 50 of the faceplate. The 4S keypad 30 is adapted to be mounted in a standard electrical wallbox (not shown) via two mounting screws 52 and two mounting holes 54.

The 4S keypad 30 further comprises a dual-inline package (DIP) switch 56, which is mounted on the printed circuit board and is accessible to a user of the keypad through an opening 58 in the base unit 40. When the 4S keypad 30 is fully assembled, the DIP switch 56 is hidden from view by the button assembly 42. The DIP switch 56 includes a plurality of maintained switches, e.g., ten (10) switches, which are used to set the unique address of the 4S keypad 30 or the 2B keypad 20. The individual switches of the DIP switch 56 are either open or closed in a binary fashion to set the address. For example, the switches may be closed to indicate a logic one (1) and opened to indicate a logic zero (0). If six of the individual switches of the DIP switch 56 are used to set the address, the address may range from zero (0) to sixty-three (63), i.e., $2^6-1$. An address of five (5) corresponds to setting the individual switches of the DIP switch 56 to 000101.

Further, the switches of the DIP switch 56 are used to set the button functionality (i.e., the functions that are selected by actuations of the buttons) and the button configuration (i.e., the number and arrangement of buttons that are provided on the button assembly 42). The base unit 40 determines which backlights to illuminate and which visual indicators to control depending upon the present button configuration. The faceplate 32 and the button assembly 42 are adapted to be removed from the 4S keypad 30 after the keypad has been shipped and installed in the field. A user may change the faceplate and the button assembly of a keypad in the field, for example, from a 4S keypad 30 to a 2B keypad 20. Because the switches of the DIP switch 56 are used to dictate the button configuration of the keypad, the individual switches of the DIP switch 56 must be changed when the button assembly 42 is changed.

Since the individual switches of the DIP switch 56 tend to be rather small and difficult to access, the process of setting the DIP switches 56 in order to configure each of the keypads can be challenging. Accordingly, the keypads may be configured incorrectly. For example, two keypads may be configured with the same address, which causes communication errors and unreliable system operation. Also, in order to change the button functionality or the button configuration, the user must remove the faceplate and the button assembly 42 to access the DIP switch 56, and must refer to a user guide in order to determine the appropriate positions of the individual switches of the DIP switch 56 to achieve the desired functionality or configuration.

Accordingly, there exists a need for a method of easily and accurately configuring a keypad, particularly when changing the button assembly and faceplate of the keypad.

SUMMARY OF THE INVENTION

According to the present invention, a method of configuring a keypad for use in a load control system comprises the steps of: (1) installing a first button assembly, which has a first button configuration, on the keypad; (2) storing in a memory of the keypad a first data representing the first button configuration; (3) removing the first button assembly; (4) installing a second button assembly, which has a second button configuration, on the keypad; (5) simultaneously actuating a first button and a second button of the second button assembly for a predetermined amount of time; and (6) storing in the memory of the keypad a second data representing the second button configuration in response to the step of simultaneously actuating a first button and a second button.

According to another embodiment of the present invention, a method of configuring a keypad for use in a load control system comprises the steps of: (1) mechanically coupling one of a plurality of different button assemblies to the keypad, the button assembly having a button configuration defining the number and arrangement of buttons on the button assembly; (2) simultaneously actuating a first button and a second button of the button assembly to actuate at least two of the switches of the keypad for a predetermined amount of time; (3) the keypad determining that the first button and the second button have been actuated for the predetermined amount of time; and (4) the keypad subsequently storing in the memory data representing the button configuration of the button assembly dependent upon which switches were actuated for the predetermined amount of time.

Other features and advantages of the present invention will become apparent from the following description of the invention that refers to the accompanying drawings.

DETAILED DESCRIPTION OF THE INVENTION

Figure 1:
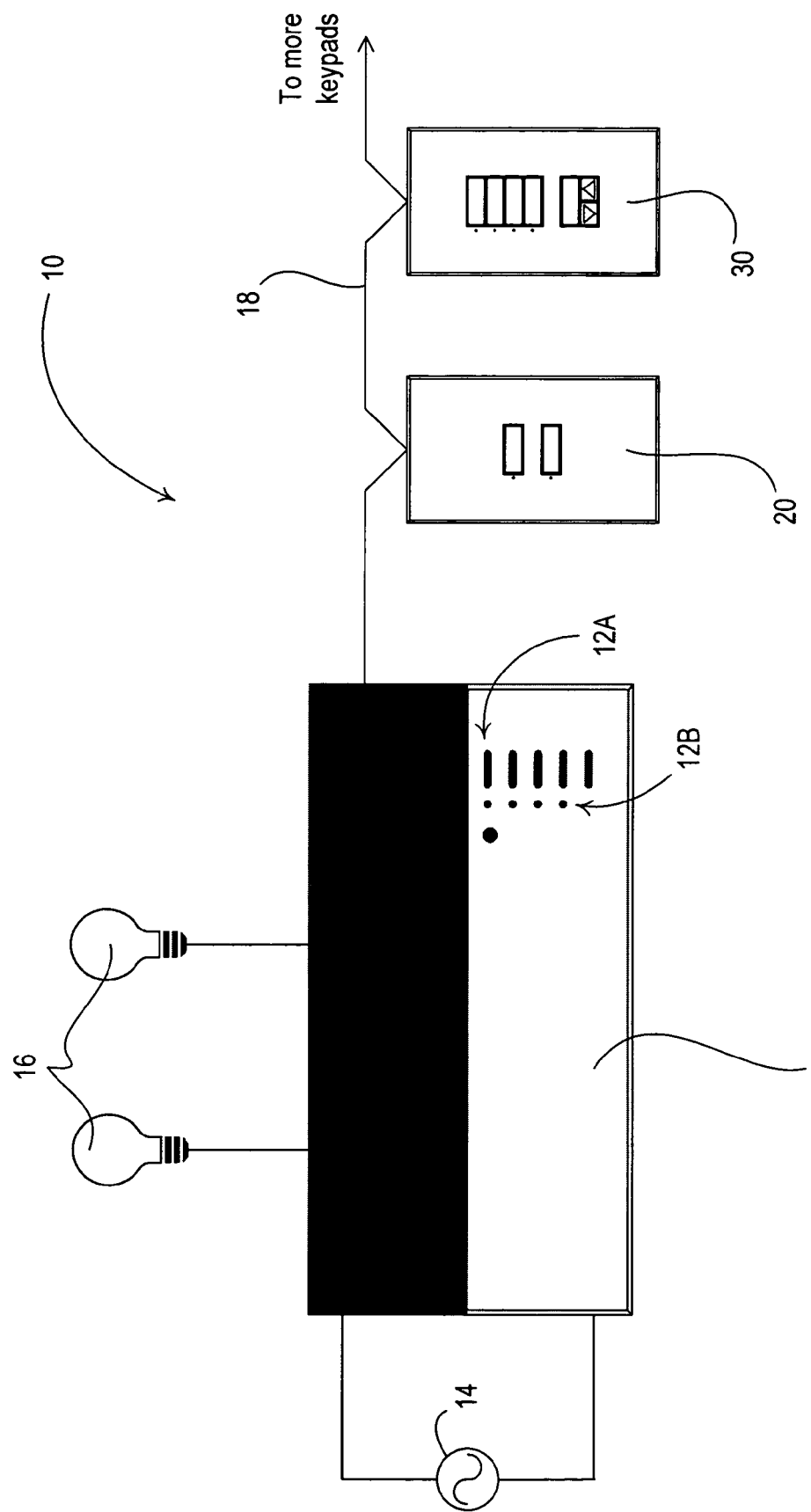
FIG. 1 is a simplified block diagram of a prior art lighting control system.

The foregoing summary, as well as the following detailed description of the preferred embodiments, is better understood when read in conjunction with the appended drawings. For the purposes of illustrating the invention, there is shown in the drawings an embodiment that is presently preferred, in which like numerals represent similar parts throughout the several views of the drawings, it being understood, however, that the invention is not limited to the specific methods and instrumentalities disclosed.

Figure 5:
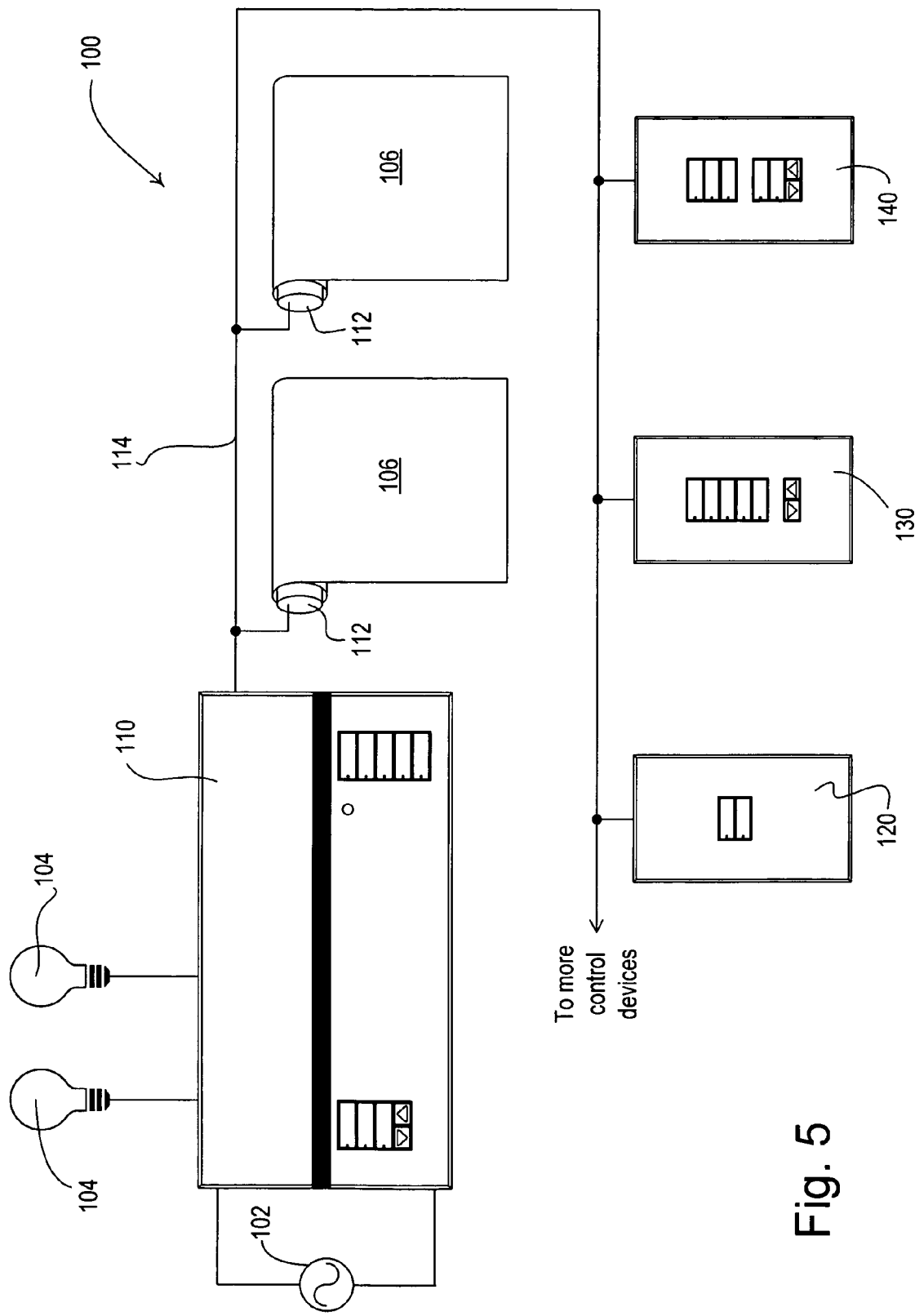
FIG. 5 is a simplified block diagram of a load control system for controlling lighting loads and motorized window treatments from an AC power source.

FIG. 5 is a simplified block diagram of a load control system 100 for control of a plurality of lighting loads 104 and a plurality of motorized window treatments, e.g., motorized roller shades 106, from an AC power source 102. The load control system 100 comprises a multi-zone load control device 110, which comprises integral dimmer circuits for controlling the intensities of the lighting loads 104. Each of the motorized roller shades 106 comprises an electronic drive unit (EDU) 112, which is preferably located inside the roller tube of the roller shade. An example of an electronic drive unit 112 is described in greater detail in commonly-assigned U.S. Pat. No. 6,983,783, issued Jun. 11, 2006, entitled MOTORIZED SHADE CONTROL SYSTEM, the entire disclosure of which is hereby incorporated by reference. The load control device 110 is operable to communicate with the electronic drive units 112 via a communication link 114, which preferably comprises a wired four-wire RS-485 communication link. Alternatively, the communication link 114 may comprise a wireless communication link, such as, for example, a radio-frequency (RF) or an infrared (IR) communication link.

The load control device 110 and the electronic drive units 112 are responsive to digital messages received from a plurality of keypads, e.g., a two-button (2B) keypad 120, a five-button raise/lower (5BRL) keypad 130, and a multi-group keypad 140, via the communication link 114. The user is able to adjust the intensities of the lighting loads 104 or to select a lighting preset of the load control device 110 using the keypads 120, 130, 140. The user is also able to open or close the motorized roller shades 106, adjust the positions of the shade fabrics of the roller shades, or set the roller shades to preset shade positions using the keypads 120, 130, 140.

Figure 2:
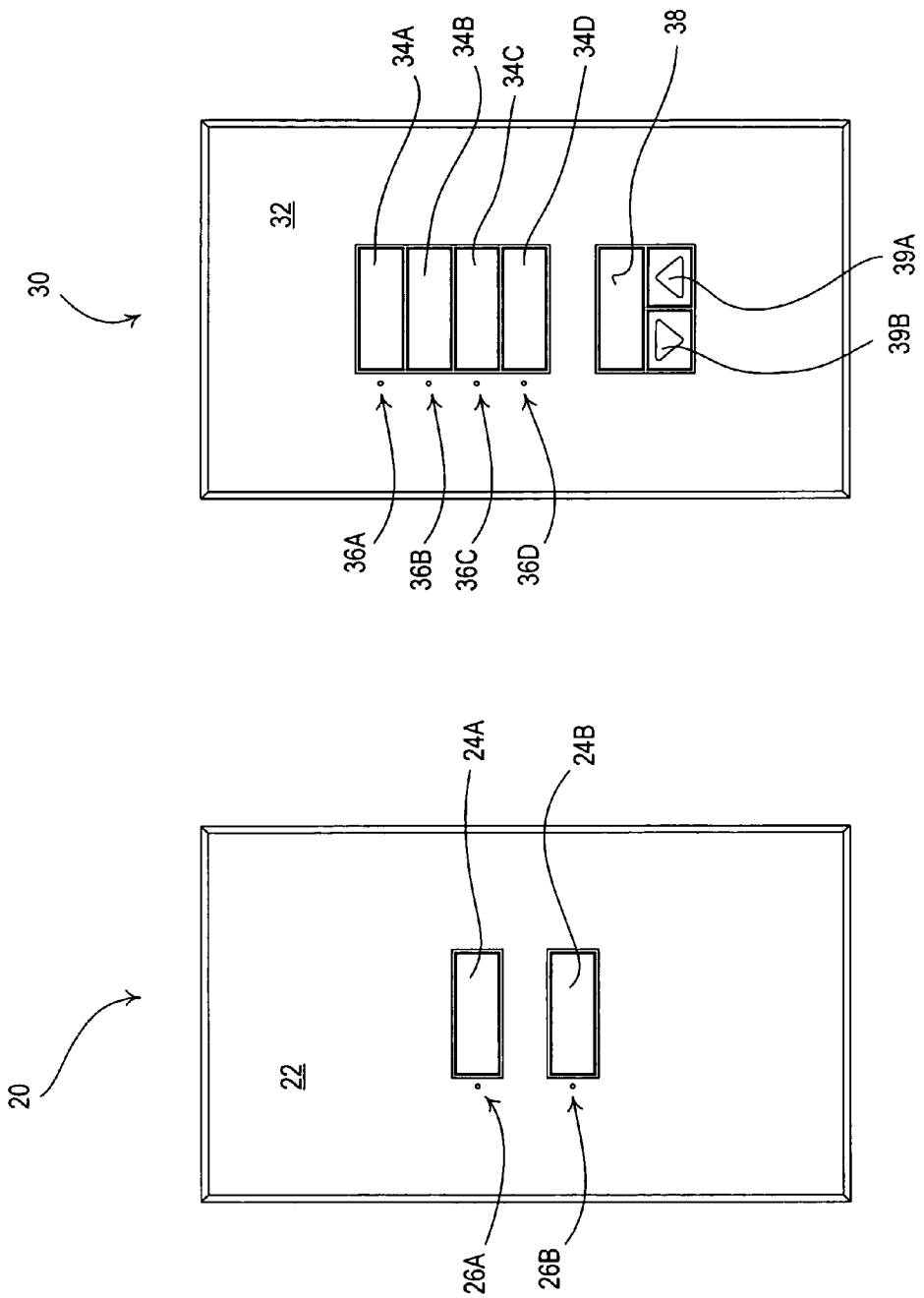
FIG. 2A is a front view of a two-button keypad of the lighting control system of FIG. 1.
FIG. 2B is a front view of a four-scene keypad of the lighting control system of FIG. 1.
Figure 6:
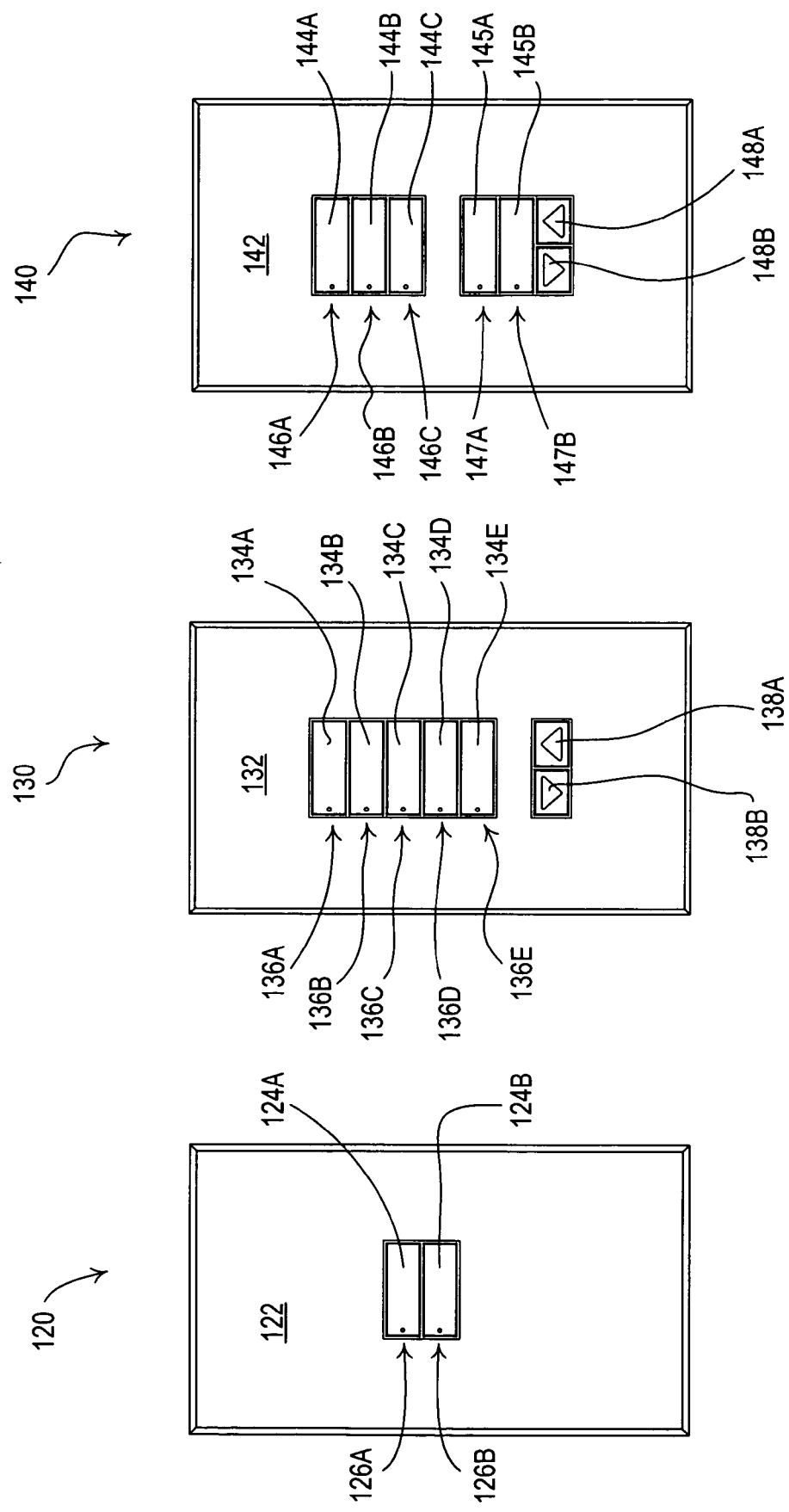
FIG. 6A is a front view of a two-button keypad of the load control system of FIG. 5.
FIG. 6B is a front view of a five-button raise/lower keypad of the load control system of FIG. 5.
FIG. 6C is a front view of a multi-group keypad of the load control system of FIG. 5.

FIGS. 6A, 6B, and 6C are front views of the 2B keypad 120, the 5BRL keypad 130, and the multi-group keypad 140. The 2B keypad 120 comprises two buttons 124A, 124B having visual indicators 126A, 126B (i.e., LEDs) located in the buttons. The 2B keypad 120 provides a similar functionality as the prior art 2B keypad 20 of FIG. 2A. The 5BRL keypad 130 comprises five scene-selection buttons 134A-134E having visual indicators 136A-136E, respectively. An actuation of any of the scene-selection buttons 134A-134E selects a respective lighting preset of the load control device 110. The visual indicators 136A-136E illuminate to indicate whether the respective lighting preset is selected. The 5BRL keypad 130 also comprises a raise button 138A and a lower button 138B.

Figure 4A:
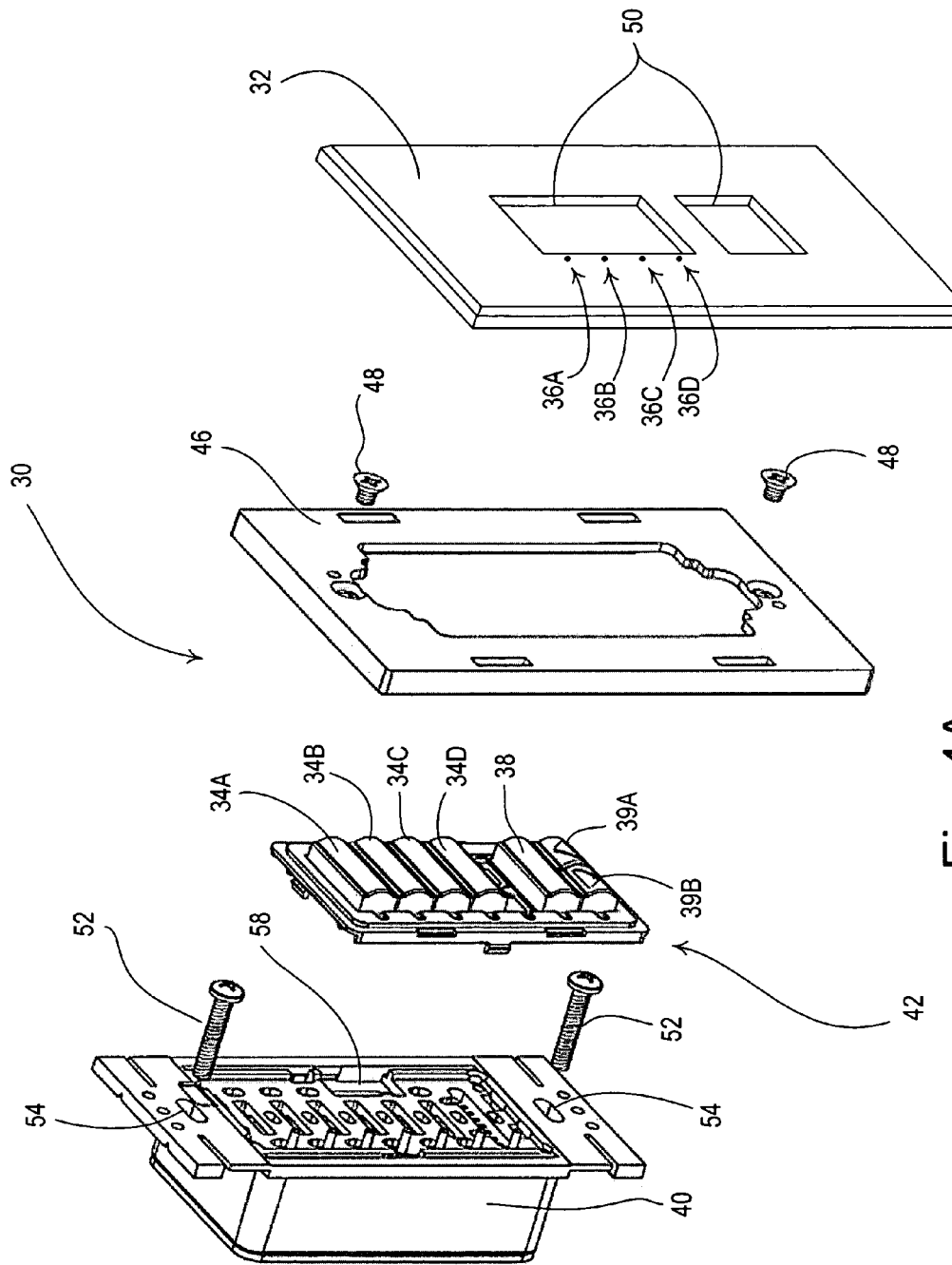
FIG. 4A is an exploded perspective view of the four-scene keypad of FIG. 2B.

The multi-group keypad 140 can independently control three groups of motorized roller shades 106. Referring to FIG. 6C, the multi-group keypad 140 comprises three group-selection buttons 144A, 144B, 144C, two control buttons 145A, 145B, a raise button 148A, and a lower button 148B. An actuation of one of the group-selection buttons 144A, 144B, 144C selects an associated group of motorized roller shades 106. Visual indicators 146A, 146B, 146C illuminate to indicate which group of motorized roller shades 106 is selected. After one of the groups is selected using the group-selection buttons 144A, 144B, 144C, the user is able to actuate the control buttons 145A, 145B, the raise button 148A, and the lower buttons 148B to control the motorized roller shades 106 of the selected group. An actuation of the first control button 145A causes the selected group of motorized roller shades 106 to move to fully-open positions, while an actuation of the second control button 145B causes the selected group of motorized roller shades to move to fully-closed positions. Actuations of the raise button 148A and the lower button 148B cause the selected group of motorized rollers shades 106 to raise and lower, respectively, while the buttons are held. Alternatively, the multi-group keypad 140 could function to control three separate groups of lighting loads 104. Note that the 2B keypad 120, the 5BRL keypad 130, and the multi-group keypad 140 have similar mechanical structures as that shown in the exploded view shown in FIG. 4A.

Figure 4B:
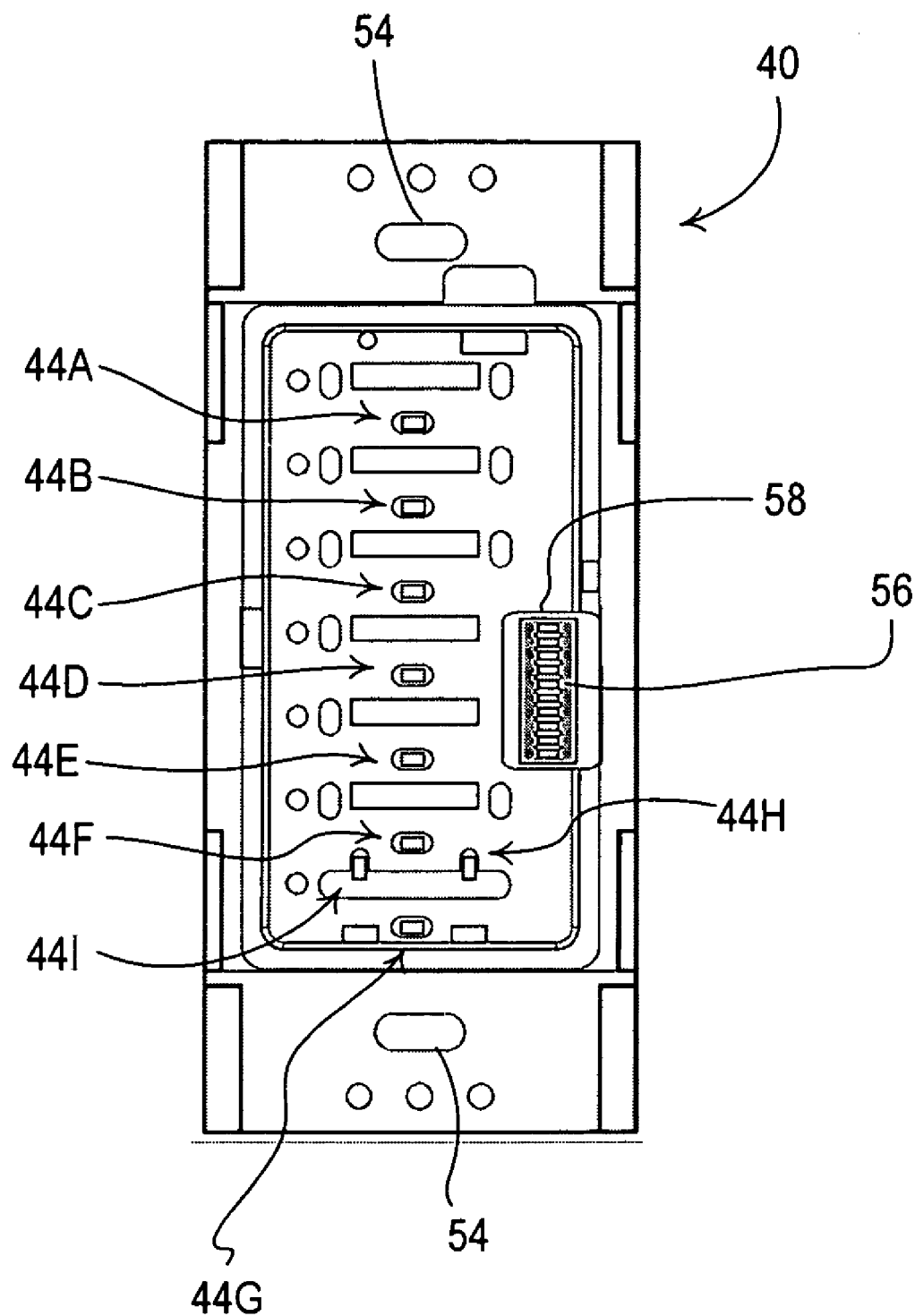
FIG. 4B is a front view of a base unit of the four-scene keypad of FIG. 4A.

To cause the keypad to enter a normal programming mode, a user presses and holds the top and bottom buttons of the button assembly, e.g., the first button 134A and the fifth button 134E, for a first predetermined amount of time (e.g., three seconds). In the normal programming mode, the user is able, for example, to assign the keypad to the load control device 110 (as in the prior art assignment procedure 80 shown in FIG. 4).

Figure 7:
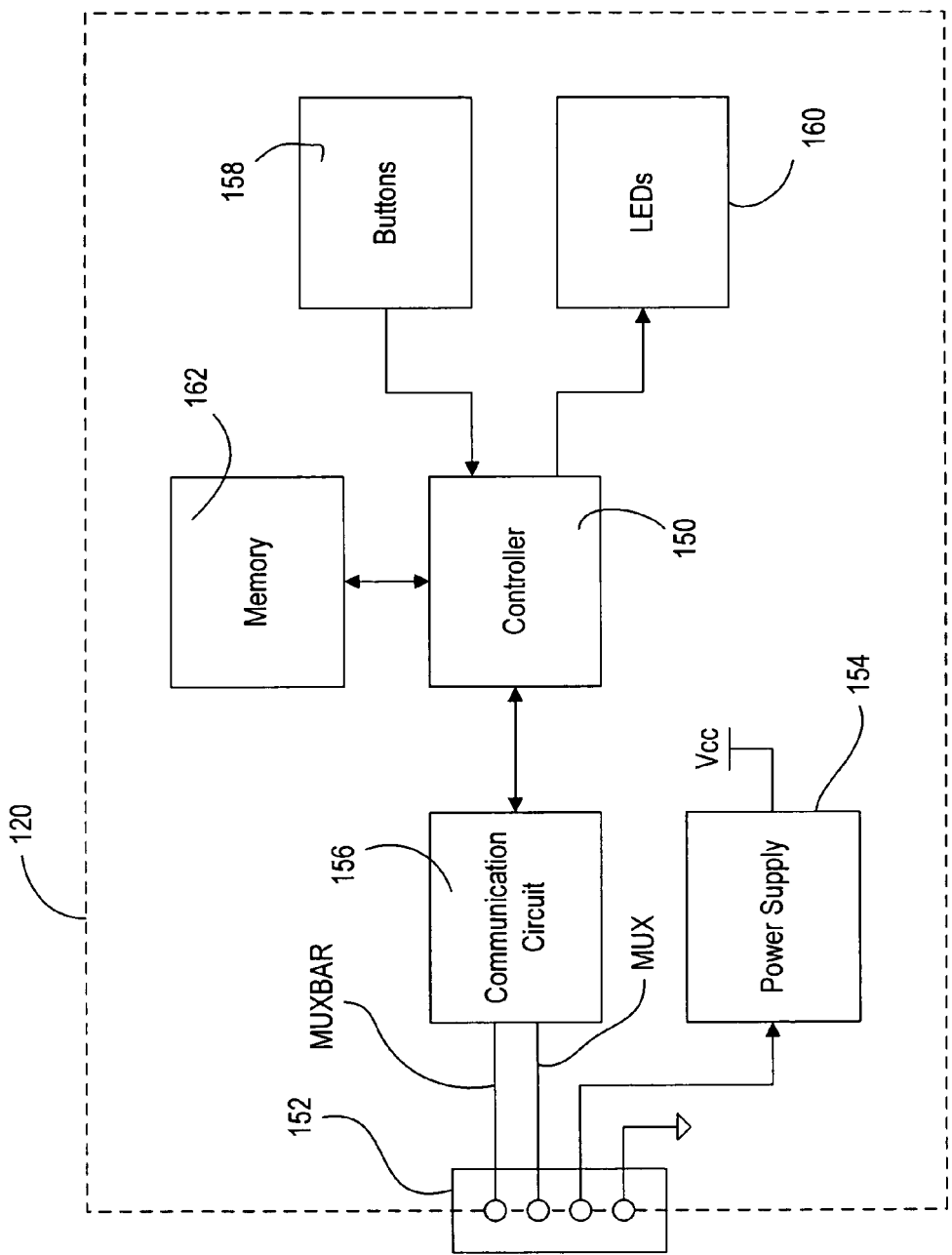
FIG. 7 is a simplified block diagram of the two-button keypad of FIG. 6A.

FIG. 7 is a simplified block diagram of the 2B keypad 120. The 5BRL keypad 130 and the multi-group keypad 140 have equivalent functional blocks. Referring to FIG. 7, the 2B keypad 120 comprises a controller 150, which is preferably implemented as a microprocessor, but may be any suitable processing device, such as, for example, a microcontroller, a programmable logic device (PLD), or an application specific integrated circuit (ASIC). The 2B keypad 120 is coupled to the four-wire communication link 114 via a four-position connector 152. A power supply 154 draws current from one of the conductors of the communication link 114 via the connector 152 and generates a direct-current (DC) voltage $V_{CC}$ for powering the controller 150 and other low-voltage circuitry of the keypad 120.

A communication circuit 156, e.g., an RS-485 transceiver, is coupled to a first data wire MUX and a second data wire MUXBAR of the communication link 114, which carry differential signals according to the RS-485 protocol. The controller 152 is coupled to the communication circuit 156, such that the controller 152 is operable to transmit and receive digital messages via the communication link 114. The controller 152 also receives inputs from a plurality of buttons 158, i.e., the first and second buttons 124A, 124B, and controls a plurality of LEDs 160, i.e., the first and second visual indicators 126A, 126B. The controller 152 is operable to store the configuration information of the 2B keypad 120 in a memory 162.

The 2B keypad 120, the 5BRL keypad 130, and the multi-group keypad 140 do not include a DIP switch for setting the address, the button functionality, and the button configuration. According to the present invention, the keypads are operable to change the programmed button functionality and configuration in response to inputs provided to the controller 150 from the buttons 158. Specifically, the keypads are operable to change the button configuration in response to a simultaneous press and hold of the top and lower buttons of the new button layout for a second predetermined amount of time longer than the first predetermined amount of time, e.g., ten (10) seconds.

Figure 8:
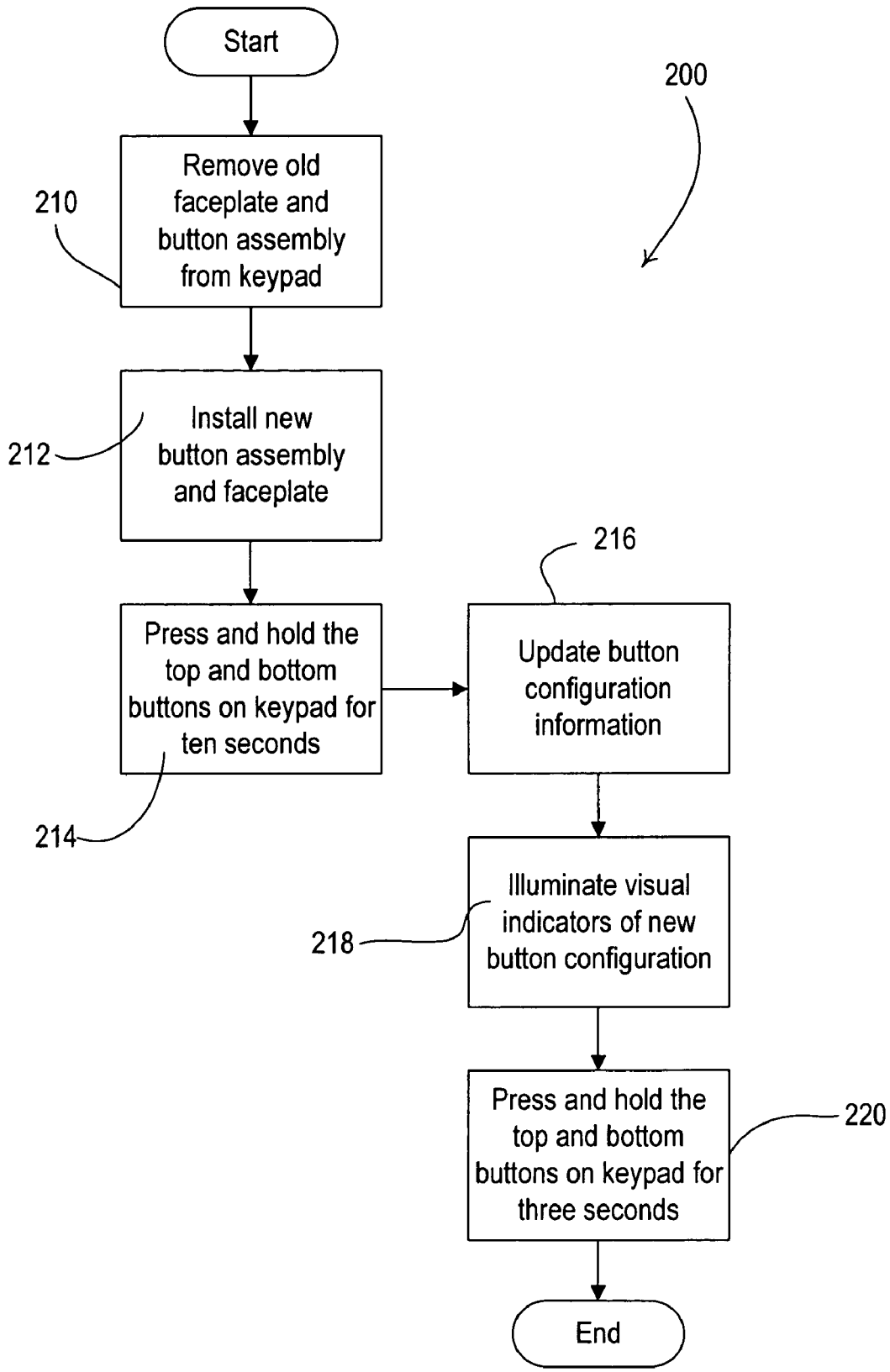
FIG. 8 is a flowchart of a button configuration procedure according to the present invention.

FIG. 8 is a flowchart of a button configuration procedure 200 according to the present invention. The user removes the old button assembly and faceplate from the keypad at step 210 and installs the new button assembly and faceplate at step 212. For example, if the user wishes to change a keypad from a 2B keypad 120 to a 5BRL keypad 130, the user first removes the 2B button assembly and faceplate 122, and then installs the 5BRL button assembly and faceplate 130. Next, the user presses and holds the top and bottom buttons of the new button assembly, e.g., the first button 134A and the fifth button 134E, for the second predetermined amount of time at step 214. Accordingly, the controller 150 of the keypad updates the button configuration information in the memory 162 at step 216, and illuminates the visual indicators of the new button configuration at step 218. Finally, the user presses and holds the top and bottom buttons for a third predetermined amount of time, e.g., three (3) seconds, at step 220, and the procedure 200 ends.

Figure 9:
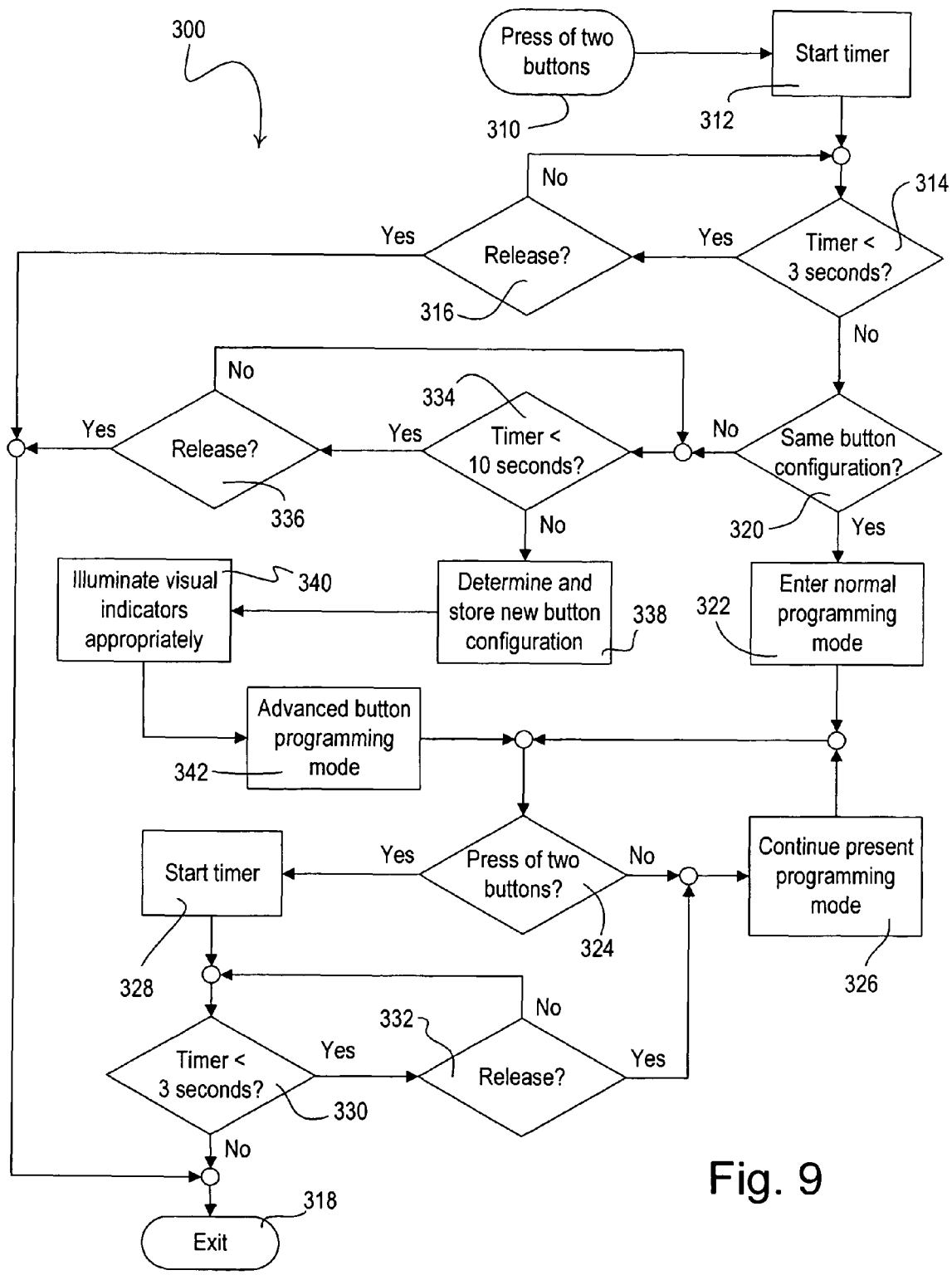
FIG. 9 is a flowchart of a programming procedure executed by a controller of the keypad of FIG. 7 during the button configuration procedure of FIG. 8.

FIG. 9 is a flowchart of a programming procedure 300 executed by the controller 150 during the button configuration procedure 200. The programming procedure 300 begins when the controller 150 detects that the user is simultaneously pressing two buttons at step 310. At step 312, the controller 150 initializes a timer to zero and starts the timer. The controller uses the timer to determine how long the user has pressed the buttons. If the time is less than the first predetermined amount of time, i.e., three (3) seconds, at step 314 and the buttons have not yet been released at step 316, the procedure 300 loops. If one or both of the buttons are released at step 316, the procedure 300 simply exits at step 318.

Figure 3:
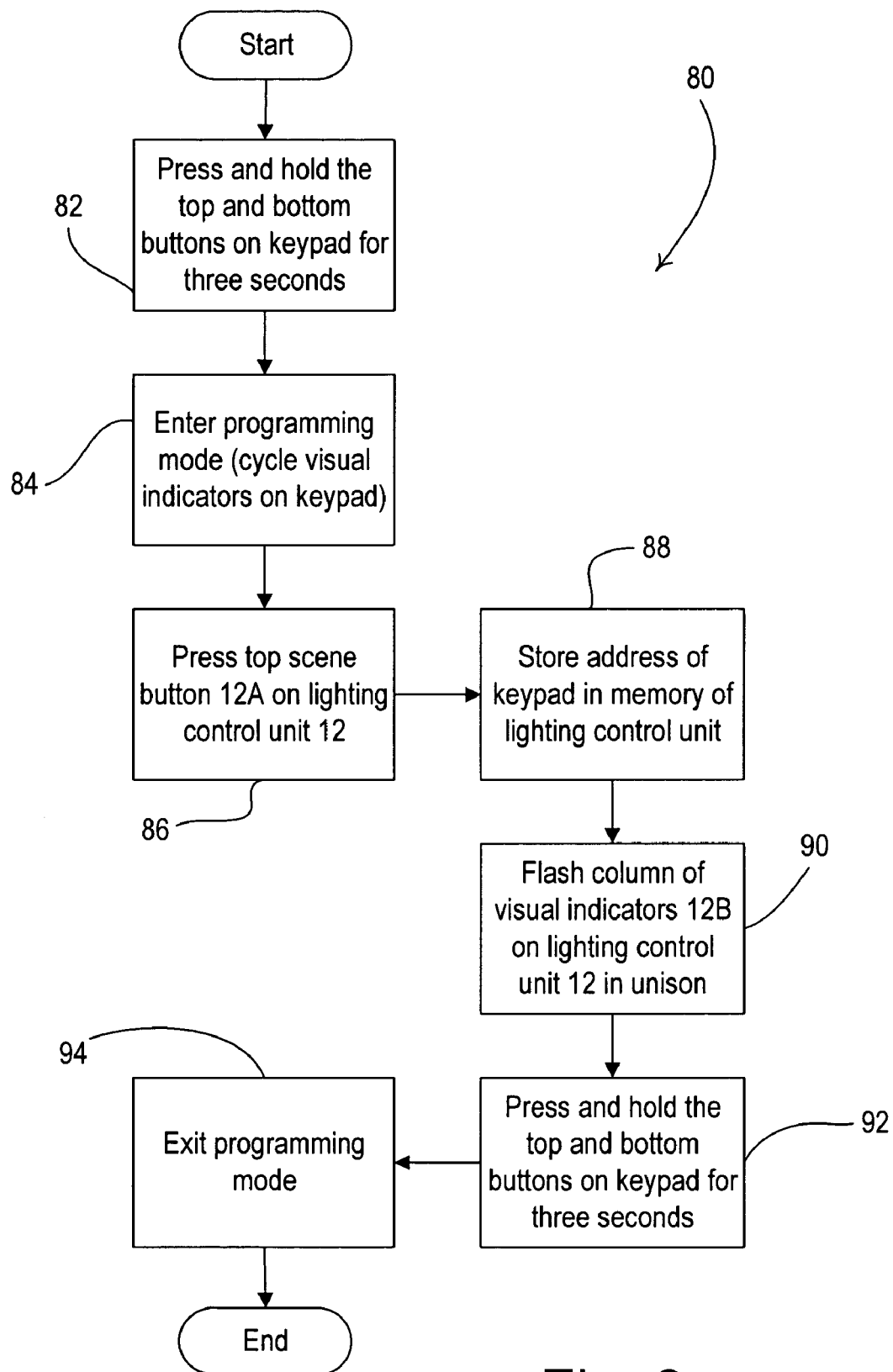
FIG. 3 is a flowchart of an association procedure for associating a keypad with the lighting control of FIG. 1.

However, if the user holds the buttons for more than three seconds at step 314, a determination is made at step 320 as to whether the user is pressing the top and bottom buttons of the button configuration that is presently stored in the memory 162. For example, if the button configuration stored in the memory 162 is for a 5BRL keypad, the controller 150 determines at step 320 whether the first button 134A and the fifth button 134E are being pressed. If so, at step 322, the keypad enters a normal programming mode, in which the user may, for example, associate the keypad with the load control device 110 in a similar fashion as the association procedure 80 shown in FIG. 3. If the user is not simultaneously pressing the top and bottom buttons of the present button configuration at step 324, the keypad continues the present programming mode, i.e., the normal programming mode, at step 326. Otherwise, the timer is initialized to zero and started at step 328 and the procedure 300 loops until the timer reaches the third predetermined amount of time, e.g., three (3) seconds, at step 330, or the buttons are released at step 332. If the buttons are released at step 332, the keypad continues in the normal programming mode at step 324. When the buttons are pressed and held until the timer exceeds three seconds at step 330, the programming procedure 300 exits.

If the controller 150 determines that the buttons pressed at step 310 are not the top and bottom buttons of the button configuration that is stored in memory, the controller 150 determines the new button configuration from the buttons that were pressed and stores data representing the new button configuration in the memory 162 at step 338. For example, if the present button configuration is a 2B keypad, but the user presses and holds the top and bottom buttons 134A, 134E of the 5BRL button assembly (i.e., corresponding to the first and fifth tactile switches 44A, 44E of the base unit 40), the controller 150 determines that the new button configuration is that of the 5BRL keypad since the first and fifth tactile switches 44A, 44E were actuated. At step 340, the controller 150 solidly illuminates the visual indicators of the new button configuration, e.g., visual indicators 136A-136E to indicate that the new button configuration has been assigned. At step 342, the keypad enters an advanced button programming mode, in which the user may, for example, determine the functionality of the buttons, i.e., that function that is selected when the buttons are actuated. If the user is not simultaneously pressing the top and bottom buttons of the present button configuration at step 324, the keypad continues the present programming mode, i.e., the advanced button programming mode, at step 326. Otherwise, the timer is initialized to zero and started at step 328. If the buttons are released at step 332 before the timer has exceeded the third predetermined threshold at step 330, the keypad continues in the advanced button programming mode at step 324. When the buttons are still being held and the timer exceeds three seconds at step 330, the programming procedure 300 exits.

The load control system 100 may include a plurality of keypads, which each may have a different button configuration. The keypads may each include up to seven scene-selection buttons or alternatively up to six scene-selection buttons and both a raise button and a lower button. Preferably, the keypads that are provided for the load control system 100 include buttons that are grouped together (i.e., as with the five scene-selection buttons 134A-134E of the 5BRL keypad 130 shown in FIG. 6B). Further, the keypads are preferably provided such that when the number of buttons on two keypads differ, the tactile switches that the top and bottom buttons actuate are also different for the two keypads. For example, the 2B keypad 120 has top and bottom buttons 124A, 124B that actuate the tactile switches 44C, 44D of the base unit 40, while the 5BRL keypad 130 has top and bottom buttons 134A, 134E that actuate the tactile switches 44A, 44E. Therefore, the controller 150 is able to distinguish the number of buttons that are provided on the button assembly 42 at step 338 of the programming procedure 300 of FIG. 8, i.e., when the user presses and holds the top and bottom buttons of the button assembly.

Some keypads are provided with a raise button and a lower button. For example, the 5BRL keypad 130 has the raise button 138A and the lower button 138B, while a five-button (5B) keypad (not shown) may only comprise the five scene-selection buttons 134A-134E. The programming procedure 300 for both the 5BRL keypad 130 and the 5B keypad are the same. The user presses and holds the top button 134A and the bottom button 134E for ten seconds in order to update the button configuration. The controller 150 does not need to know that the raise button 138A and the lower button 138B are not provided on the button assembly for the 5B keypad. Since these buttons are not provided on the button assembly, the controller never receives inputs from the tactile switches 44H, 44I, which are actuated by the raise button 138A and the lower button 138B.

However, some keypads have button configurations that cannot be updated by simply pressing and holding the top and bottom buttons on the button assembly for ten seconds. For example, since the multi-group keypad 140 has two sets of buttons (i.e., the group-selection buttons 144A, 144B, 144C, and the control buttons 145A, 145B), the user must use the advanced programming mode of step 342 to correctly configure the multi-group keypad. To enter the advanced programming mode, the user must press and hold the first group-selection button 144A and the second control button 145B for ten seconds. In the advanced programming mode, the user is able to set the button configuration to a multi-group keypad.

The advanced programming mode provides a plurality of "menus" of options to setup the button functionality and button configuration. The advanced programming mode may provide a "column menu", from which the user can select the desired functionality and/or configuration of the column of buttons on the keypad. For example, the user can select whether the actuations of the buttons should select lighting presets of the load control device 110 or preset shade positions of the electronic drive units 112, or should operate as the multi-group keypad 140. Further, the advanced programming mode may provide an "LED menu" (from which the user can enable and disable the backlights) and a "shade menu" (from which the user can select how the electronic drive units 112 operate in response to actuations of the buttons). The menus and options that are provided are dependent upon the present button configuration of the keypad. The controller 150 communicates the different menus and options to the user by illuminating or flashing different LEDs, for example, the user may flash a first LED to indicate that the column menu is selected or flash a second LED to indicate that the button menu is selected.

To navigate to the different menus, the user double-taps the top button (i.e., presses the top button with two transitory actuations in quick succession) to move to the next menu option and double-taps the bottom button to move to the previous menu. To select the current menu, the user presses and holds any button for a predetermined amount of time. The user can then simply press buttons to select and deselect the different options of the current menu. Preferably, an advanced programming mode user guide is provided to the user to assist in the selection of button functionality and configuration options of the keypad. An advanced programming mode for a wall-mounted dimmer is described in greater detail in co-pending commonly-assigned U.S. patent application Ser. No. 10/892,510, filed Jul. 15, 2004, entitled PROGRAMMABLE WALLBOX DIMMER, the entire disclosure of which is hereby incorporated by reference.

During the manufacture of a keypad, the keypad is preferably fitted with a button assembly and faceplate and is configured correctly using a procedure similar to the button configuration procedure 200 shown in FIG. 8 (except that step 210 is omitted). Accordingly, when installed, the keypad is configured correctly without the need of executing any configuration procedure. Alternatively, the base unit of the keypad (i.e., base unit 40) may be shipped separately from the faceplate and the button assembly. During installation, the user would install the base unit 40 with the button assembly and the faceplate, and then simply press and hold the top and bottom buttons for ten seconds in order to configure the keypad.

Although the present invention has been described in relation to particular embodiments thereof, many other variations and modifications and other uses will become apparent to those skilled in the art. It is preferred, therefore, that the present invention be limited not by the specific disclosure herein, but only by the appended claims.

What is claimed is:

1. A method of configuring a keypad for use in a load control system, the keypad comprising a plurality of switches, the method comprising the steps of:
   mechanically coupling one of a plurality of different button assemblies to the keypad, the button assembly having a button configuration defining the number and arrangement of buttons on the button assembly;
   simultaneously actuating a first button and a second button of the button assembly to actuate at least two of the switches of the keypad for a predetermined amount of time;
   the keypad detecting that the first button and the second button have been actuated for the predetermined amount of time; and
   the keypad subsequently storing in a memory data representing the button configuration of the button assembly dependent upon which switches were actuated for the predetermined amount of time.

2. The method of claim 1, further comprising the step of:
   entering an advanced programming mode in response to the step of the keypad detecting that the first button and the second button have been actuated for the predetermined amount of time; and
   subsequently changing the data representing the button configuration in the memory using the advanced programming mode.

3. The method of claim 2, wherein the step of simultaneously actuating a first button and a second button of the button assembly to actuate at least two of the switches of the keypad for a predetermined amount of time comprises simultaneously actuating a first button and a second button of the button assembly to actuate the at least two of the switches of the keypad for a second predetermined amount of time;
   the method further comprising the steps of:
   simultaneously actuating the first button and the second button of the button assembly to actuate the at least two of the switches of the keypad for a first predetermined amount of time, the first predetermined amount of time less than the second predetermined amount of time;
   releasing the first button and the second button of the button assembly after the first predetermined amount of time and before the second predetermined amount of time;
   entering a normal programming mode in response to the step of releasing the first button and the second button of the button assembly.

4. The method of claim 3, further comprising the steps of:
   simultaneously actuating the first button and the second button of the button assembly to actuate the at least two of the switches of the keypad for a third predetermined amount of time; and
   exiting the advanced programming mode in response to the step of simultaneously actuating the first button and the second button of the button assembly to actuate the at least two of the switches of the keypad for a third predetermined amount of time.

5. The method of claim 3, wherein the first predetermined amount of time is approximately three seconds and the second predetermined amount of time is approximately ten seconds.

6. The method of claim 2, further comprising the steps of:
   providing a plurality of menus of options as part of the advanced programming mode;
   actuating a third button of the button assembly;
   selecting a first menu in response to the step of actuating a third button;
   illuminating a first visual indicator in response to the step of selecting a first menu;
   actuating a fourth button of the button assembly; and
   changing the data representing the button configuration in the memory in response to the step of actuating the fourth button.

7. The method of claim 1, wherein the button assembly comprises a plurality of buttons, and the first button and the second button comprise the top button and the bottom button of the button assembly, respectively.

8. The method of claim 7, wherein the buttons of the button assembly are grouped together.

9. The method of claim 1, further comprising the step of:
   illuminating a plurality of visual indicators in response to the step of the keypad detecting that the first button and the second button have been actuated for the predetermined amount of time.

10. The method of claim 9, wherein the plurality of visual indicators that are illuminated are representative of the button configuration of the button assembly.

11. The method of claim 1, further comprising the step of:
    illuminating a plurality of backlights in response to the step of the keypad detecting that the first button and the second button have been actuated for the predetermined amount of time, the backlights operable to illuminate the button assembly.

12. A method of configuring a keypad for use in a load control system, the method comprising the steps of:

installing a first button assembly on the keypad, the first button assembly having a first button configuration;

storing in a memory of the keypad a first data representing the first button configuration;

removing the first button assembly;

installing a second button assembly on the keypad, the second button assembly having a second button configuration;

simultaneously actuating a first button and a second button of the second button assembly for a predetermined amount of time; and storing in the memory of the keypad a second data representing the second button configuration in response to the step of simultaneously actuating a first button and a second button.

13. The method of claim 12, wherein the step of installing a first button assembly on the keypad and the step of storing in a memory of the keypad a first data representing the first button configuration are completed during a manufacturing process of the keypad.

14. The method of claim 13, wherein the step of installing a second button assembly on the keypad, the step of simultaneously actuating a first button and a second button of the second button assembly for a predetermined amount of time; and the step of storing in the memory of the keypad a second data representing the second button configuration are completed after the keypad is installed after the manufacturing process.

* * * * *